(12) United States Patent
Kushida et al.

(10) Patent No.: US 12,206,336 B2
(45) Date of Patent: Jan. 21, 2025

(54) POWER CONVERTER

(71) Applicant: Mitsubishi Electric Corporation, Tokyo (JP)

(72) Inventors: Koichiro Kushida, Tokyo (JP); Masahiro Katsumura, Tokyo (JP); Yoshio Mizoguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 18/724,623

(22) PCT Filed: Apr. 6, 2022

(86) PCT No.: PCT/JP2022/017180
§ 371 (c)(1),
(2) Date: Jun. 27, 2024

(87) PCT Pub. No.: WO2023/195100
PCT Pub. Date: Oct. 12, 2023

(65) Prior Publication Data
US 2024/0421720 A1  Dec. 19, 2024

(51) Int. Cl.
*H05K 7/02* (2006.01)
*H02M 7/00* (2006.01)
*H05K 7/04* (2006.01)

(52) U.S. Cl.
CPC .................. *H02M 7/003* (2013.01)

(58) Field of Classification Search
CPC ........... B32B 27/12; H01L 2224/32225; H01L 2224/48137; H01L 2224/73265;
(Continued)

(56) References Cited

U.S. PATENT DOCUMENTS

| 4,399,452 A | * | 8/1983 | Nakashima | ............. H01L 23/16 |
| | | | | 257/689 |
| 6,295,205 B1 | * | 9/2001 | Lang | ..................... H01L 23/051 |
| | | | | 174/544 |

(Continued)

FOREIGN PATENT DOCUMENTS

| CN | 212518769 U | 2/2021 | |
| CN | 116800060 A | * 9/2023 | ............. H02M 1/00 |

(Continued)

OTHER PUBLICATIONS

Notice of Reasons for Refusal mailed on Sep. 6, 2022, received for JP Application 2022-547149, 06 pages including English Translation.

(Continued)

*Primary Examiner* — Timothy J Thompson
*Assistant Examiner* — Guillermo J Egoavil
(74) *Attorney, Agent, or Firm* — XSENSUS LLP

(57) ABSTRACT

A converter includes a diode module including a diode bridge disposed inside a module case; and a body case including an opening in a placement face. The module case includes a counter face facing the placement face and a noncounter face, with a breakage prevention structure being disposed on at least one of the counter face or the noncounter face. When the counter face is where the breakage prevention structure is disposed, the breakage prevention structure entirely covers the counter face. When the noncounter face is where the breakage prevention structure is disposed, the noncounter face where the breakage prevention structure is disposed is a noncounter placement face with a largest area among exterior wall faces of the module case, and the noncounter placement face including an area farther from the placement face than a middle of the noncounter placement face is as a nonplacement area.

9 Claims, 4 Drawing Sheets

(58) Field of Classification Search
CPC ..... H01L 23/04; H01L 23/053; H01L 23/055;
H01L 23/06; H01L 23/16; H01L 23/20;
H01L 23/24; H01L 23/562; H01L 25/072;
H01L 2924/00012; H01L 2924/171;
H01L 2924/1711; H01L 2924/1715; H01L
2924/181; H01L 2924/1811; H01L
2924/1815; H01L 2924/19107; H05K
5/00; H05K 7/02; H05K 7/04; H02M
7/003; H02M 7/00
USPC ................ 361/807, 715, 735, 783; 174/544;
428/98
See application file for complete search history.

(56) References Cited

U.S. PATENT DOCUMENTS

| | | | | |
|---|---|---|---|---|
| 6,297,549 | B1* | 10/2001 | Hiyoshi | ................ H01L 25/072 |
| | | | | 257/726 |
| 11,972,991 | B2* | 4/2024 | Shiota | ..................... H01L 23/04 |
| 2015/0069589 | A1 | 3/2015 | Kamata | |
| 2021/0190552 | A1* | 6/2021 | Oda | ........................ G01D 11/24 |

FOREIGN PATENT DOCUMENTS

| | | | | |
|---|---|---|---|---|
| JP | S64-077153 | A | | 3/1989 |
| JP | H03-128678 | A | | 5/1991 |
| JP | H05-175362 | A | | 7/1993 |
| JP | H08-182346 | A | | 7/1996 |
| JP | H09-130064 | A | | 5/1997 |
| JP | 2000-091455 | A | | 3/2000 |
| JP | 2004-153944 | A | | 5/2004 |
| JP | 2005223299 | A | * | 8/2005 ............... H05K 7/14 |
| JP | 2015-056487 | A | | 3/2015 |
| WO | 2020/157960 | A1 | | 8/2020 |

OTHER PUBLICATIONS

Notice of Reasons for Refusal mailed on Jan. 24, 2023, received for JP Application 2022-547149, 05 pages including English Translation.

Decision to grant a patent mailed on Jun. 20, 2023, received for JP Application 2022-547149, 03 pages including English Translation.

International Search Report and Written Opinion mailed on Jun. 21, 2022, received for PCT Application PCT/JP2022/017180, filed on Apr. 6, 2022, 11 pages including English Translation.

* cited by examiner

POWER CONVERTER

CROSS-REFERENCE TO RELATED APPLICATION

The present application is based on International Application No. PCT/JP2022/017180, filed Apr. 6, 2022, the entire contents of which are incorporated herein by reference.

FIELD

The present disclosure relates to a power converter with a rectification function.

BACKGROUND

A power converter, such as a converter, includes a diode module in which a diode bridge is integrated into one package (module case). When any diode within this diode module experiences a short circuit breakdown, a path is created in the diode module, short-circuiting two phases of three-phase alternating current (AC) via the diode with the short circuit breakdown and another diode. Therefore, an excessive current (short circuit current) flows within the diode module, causing a rapid increase in internal temperature of the diode module and an increase in internal pressure and resulting in destruction of the module case of the diode module.

The diode module is typically filled with a sealing material, such as silicone gel. During the destruction of the module case of the diode module, the heated sealing member scatters. Therefore, a general measure for preventing the excessive current flow during the short circuit breakdown of the diode module is to insert external protective devices (fast-blow fuses) in series with at least two phases of the three-phase AC, which is input for the converter. However, this measure causes increased costs and increased physical space for the power converter, such as the converter.

A semiconductor device described in Patent Literature 1 addresses such a short circuit within a diode module by including a fibrous reinforcing member wound at an outer circumference of a frame surrounding an outer circumference of a semiconductor chip for preventing broken pieces of a component of the semiconductor device from being scattered out of the semiconductor device.

CITATION LIST

Patent Literature

Patent Literature 1: PCT International Publication No. 2020/157960

SUMMARY OF INVENTION

Problem to be Solved by the Invention

However, a problem with the above technique described in Patent Literature 1 is that when destruction occurs to such an extent that broken pieces of a component of the diode module are scattered out of a module case, the broken pieces scatter out of a power converter, such as a converter, and deteriorate reliability of equipment disposed externally to the power converter.

The present disclosure has been made in view of the above, and an object of the present disclosure is to obtain a power converter that allows for maintained reliability of equipment disposed externally to the power converter even when destruction occurs to such an extent that broken pieces of a component of a diode module are scattered out of a module case.

Means to Solve the Problem

In order to solve the above-stated problem and achieve the object, a power converter according to the present disclosure includes a diode module including a diode bridge with a rectification function disposed inside a module case; and a body case housing the diode module and including an opening in a part of a first face. In the power converter according to the present disclosure, the module case has exterior wall faces, including a counter face facing the first face and a noncounter face that is an exterior wall face other than the counter face, with a breakage prevention structure being disposed on at least one of the counter face or the noncounter face to prevent a breakage of the module case. In the power converter according to the present disclosure, when the counter face is where the breakage prevention structure is disposed, the breakage prevention structure is a first breakage prevention structure entirely covering the counter face. When the noncounter face is where the breakage prevention structure is disposed, the breakage prevention structure is a second breakage prevention structure, the noncounter face where the breakage prevention structure is disposed being a noncounter placement face with a largest area among the exterior wall faces of the module case. The noncounter placement face includes at least a portion of an area farther from the first face than a middle of the noncounter placement face is as a nonplacement area where the breakage prevention structure is not disposed.

Effects of the Invention

The power converter according to the present disclosure has an effect of allowing for maintained reliability of equipment disposed externally to the power converter even when destruction occurs to such an extent that broken pieces of a component of the diode module are scattered out of the module case.

DESCRIPTION OF EMBODIMENTS

With reference to the drawings, a detailed description is hereinafter provided of power converters according to embodiments of the present disclosure.

First Embodiment

Figure 1:
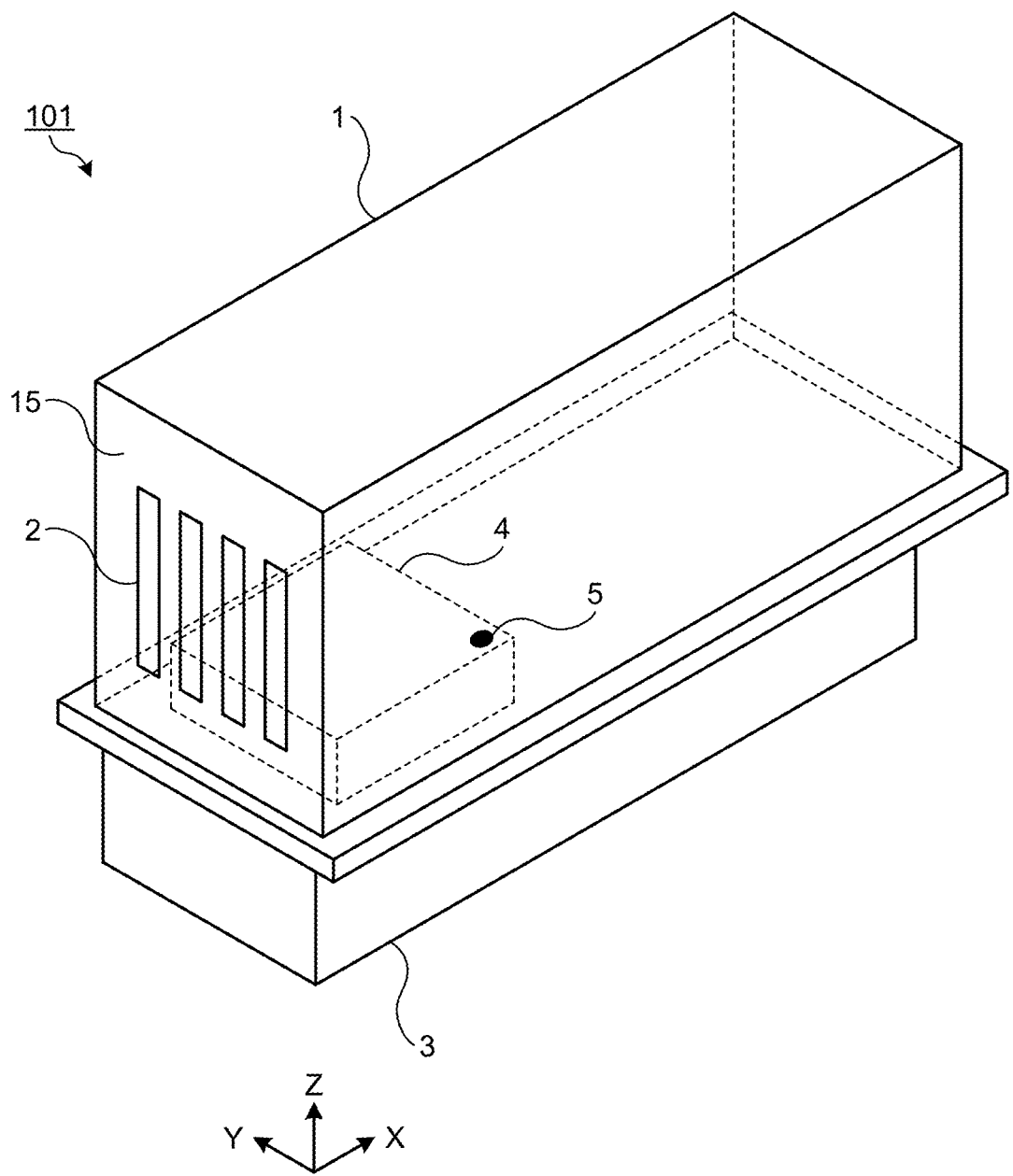
FIG. 1 is a diagram illustrating a configuration of a converter according to a first embodiment.

FIG. 1 is a diagram illustrating a configuration of a converter according to a first embodiment. In a description provided below, two axes orthogonal to each other in a plane parallel to a top face of the converter 101, which is a power converter, are an X-axis and a Y-axis. An axis orthogonal to the X- and Y-axes is a Z-axis. A body case 1 of the converter 101 is, for example, a rectangular parallelepiped, with its top and bottom faces parallel to an X-Y plane. In the following description, the body case 1 is described to have two side faces parallel to an X-Z plane and a front and a back face parallel to a Y-Z plane. The terms "top face", "bottom face", "side face", "front face", and "back face" of the body case 1 are used as convenient names for respectively describing the faces of the body case 1 and do not determine actual orientation of the converter 101.

The converter 101 internally includes one or more diode modules 4. The converter 101 includes, for example, a rectification function of converting three-phase AC into direct current (DC). The converter 101 may be disposed inside an inverter.

The converter 101 includes the body case 1 and a cooling fin 3 as an exterior. The body case 1 includes, in a part, body case slits 2 intended for exchange of internal air of the converter 101 and external air. The body case slits 2 are openings in the body case 1. The slit-shaped openings of the body case 1 are not limiting. The openings may be of any shapes. The body case 1 of the converter 101 houses the diode module(s) 4.

The diode module 4 disposed in the converter 101 includes a diode bridge housed in a case (later described as a module case 10). The module case 10 is in physical contact with the cooling fin 3 at a face (bottom face).

The module case 10 is, for example, a rectangular parallelepiped, with its top and bottom faces parallel to the X-Y plane. The module case 10 has two side faces parallel to the X-Z plane and a front and a back face parallel to the Y-Z plane. The terms "top face", "bottom face", "side face", "front face", and "back face" of the module case 10 are used as convenient names for respectively describing the faces of the module case 10 and do not determine actual orientation of the module case 10.

The diode module 4 is disposed in the converter 101, with the front face of the diode module 4 facing a placement face (first face) 15 for the body case slits 2. In other words, the placement face 15 for the body case slits 2 is parallel to the Y-Z plane. When viewed from the front face of the diode module 4, a right-hand one of the side faces of the diode module 4 is a right side face, while a left-hand one is a left side face.

Among exterior wall faces serving as a covering of the module case 10, a counter face facing the placement face 15 for the body case slits 2 is a face having an angle of less than 90 degrees relative to the placement face 15 for the body case slits 2. Any noncounter face not facing the placement face 15 for the body case slits 2 is a face having an angle of 90 degrees or more relative to the placement face 15 for the body case slits 2.

For the diode module 4 illustrated in FIG. 1, its front face refers to the counter face that faces the placement face 15 for the body case slits 2, and its other faces refer to the noncounter faces.

The orientation of the diode module 4 with respect to the body case slits 2 is crucial in the converter 101. FIG. 1 and FIGS. 2 to 5 to be mentioned later illustrate a reference point 5 on the top face of the diode module 4 for convenience of explanation. The orientation of the diode module 4 with respect to the body case slits 2 is described with the use of the reference point 5. The reference point 5 is a point near a vertex connecting with the top face, the right side face, and the back face of the diode module 4.

The diode module 4 includes the at least one diode bridge that has a rectification function. The diode module 4 may be a commonly called insulated gate bipolar transistor (IGBT) module, a module where switching elements and a diode bridge are connected in parallel. Alternatively, the diode module 4 may be a commonly called intelligent power module, a module where switching elements and a diode bridge are connected in parallel, with a circuit that drives the switching elements connected.

Figure 2:
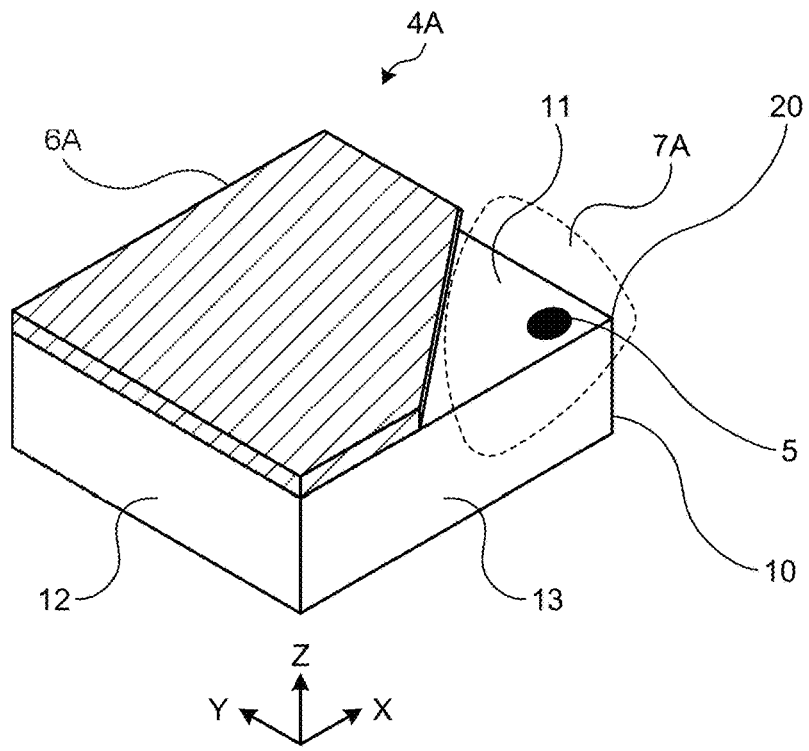
FIG. 2 is a diagram illustrating a configuration of a diode module included in the converter according to the first embodiment.

FIG. 2 is a diagram illustrating a configuration of a diode module included in the converter according to the first embodiment. The diode module 4A is an example of the diode module 4.

The diode module 4A includes a breakage prevention structure 6A at an exterior wall portion. The breakage prevention structure 6A is disposed, for example, on a face with a largest area among faces (exterior wall faces) serving as a covering of the diode module 4A. The module case 10 of the diode module 4A in FIG. 2 is described to have the top face 11 and the bottom face as the faces with the largest areas among the exterior wall faces, which serve as the covering of the diode module 4A. The face with the largest area refers to any face that has a largest area when viewed in a direction parallel to a normal vector. In other words, in cases where there are plural faces with the same area when viewed in directions parallel to a normal vector, those plural faces are faces with largest areas.

The breakage prevention structure 6A illustrated in FIG. 2 is disposed on the top face 11 of the module case 10 of the diode module 4A. The diode module 4A of FIG. 2 is assumed to be disposed like the diode module 4 of FIG. 1 inside the converter 101. In other words, the diode module 4A is disposed inside the converter 101, with the front face 12 of the module case 10 facing the placement face 15 for the body case slits 2. The reference point 5 is the point near the vertex 20 connecting with the top face 11, the right side face 13, and the back face among the exterior wall faces. In other words, the reference point 5 is positioned on the top face 11 of the module case 10, away from the body case slits 2. Among the exterior wall faces of the module case 10, the front face 12 refers to the counter face that faces the placement face 15 for the body case slits 2, and the other faces refer to the noncounter faces. The top face 11 among the exterior wall faces of the module case 10 is a noncounter placement face. In cases where there are plural faces with largest areas among the noncounter faces of the module case 10, the breakage prevention structure 6A may be disposed on at least one of those faces.

The breakage prevention structure 6A has a shape that covers a portion of the top face 11 of the diode module 4A but not a remaining portion (nonplacement area 7A) of the top face 11. The nonplacement area 7A is an area including the reference point 5. FIG. 2 illustrates the nonplacement area 7A as a triangular area including the reference point 5.

The nonplacement area 7A is the area of the top face 11 of the module case 10 that is farther from the placement face 15 than a middle of the top face 11 is. In other words, while the nonplacement area 7A of FIG. 2 is described as the triangular area that includes the reference point 5, the nonplacement area 7A may have, for example, a polygonal shape, a circular shape, or another shape, as long as the nonplacement area 7A is farther from the placement face 15 than the middle of the top face 11 is and is the area of the top face 11 where the breakage prevention structure 6A is not disposed. Since the reference point 5 is illustrated for the convenience of explanation, it goes without saying that the nonplacement area 7A does not need to include the reference point 5. The breakage prevention structure 6A is an example of a second breakage prevention structure.

The breakage prevention structure 6A is noncombustible. The breakage prevention structure 6A includes, for example, a hard material or an adhesive. The breakage prevention structure 6A is disposed in close contact with the top face 11 of the module case 10 and prevents or lessens breakage of a closely contacting portion of the module case 10 when the diode module 4A is about to be destroyed (to explode) from within.

Examples of the hard material as a material for the breakage prevention structure 6A include poly butylene terephthalate (PBT) and epoxy glass, among others. Examples of the adhesive include polycarbonate, among others.

The breakage prevention structure 6A has a role of receiving impact of the breakage of the diode module 4A. Therefore, the breakage prevention structure 6A may be affixed to the diode module 4A to be fixed or may be fixed to a fixed part that remains intact even when the diode module 4A breaks (such as the cooling fin 3 in FIG. 1 or another part). The breakage prevention structure 6A may be disposed in any way that enables the breakage prevention structure 6A to receive the impact of the breakage of the diode module 4A. For example, the breakage prevention structure 6A may be fixed by being disposed and held between a component (not illustrated) of the converter 101 and the diode module 4A inside the body case 1 of the converter 101.

As illustrated in FIG. 2, the diode module 4A has the breakage prevention structure 6A disposed. Therefore, during the destruction of the diode module 4A, the portion where the breakage prevention structure 6A is disposed is not destroyed. In other words, during the destruction of the diode module 4A, a part where the breakage prevention structure 6A is not disposed is destroyed. For example, the nonplacement area 7A and others are destroyed during the destruction of the diode module 4A. In the first embodiment, among the exterior wall faces, which serve as the covering of the diode module 4A, the top face 11 is the face with the largest area and is most susceptible to force from inside the module case 10, thus being most likely to be destroyed. By having the portion where the breakage prevention structure 6A is disposed and the nonplacement area 7A where the breakage prevention structure 6A is not disposed, the top face 11 of the module case 10, the face with the largest area that is most susceptible to the force from inside the module case 10, is enabled to have a strength difference and direct destruction to the nonplacement area 7A.

As described above, when the noncounter face among the exterior wall faces of the module case 10 is where the breakage prevention structure 6A is disposed, for the diode module 4A, the noncounter face where the breakage prevention structure 6A is disposed is the top face 11 (noncounter placement face), which is the noncounter face with the largest area among the exterior wall faces of the module case 10. Furthermore, for the diode module 4A, the top face 11 where the breakage prevention structure 6A is disposed has the portion of an area farther from the placement face 15 than the middle of the top face 11 is as the nonplacement area 7A.

Since the module case 10 of the diode module 4A according to the first embodiment has the portion (nonplacement area 7A) where the breakage prevention structure 6A is not disposed and the portion where the breakage prevention structure 6A is disposed, the destruction can be directed to the portion to be destroyed during the destruction of the diode module 4A. In other words, the diode module 4A is capable of directing the destruction to the nonplacement area 7A of the module case 10, where the breakage prevention structure 6A is not disposed.

For the module case 10 of the diode module 4A of the first embodiment, the nonplacement area 7A where the breakage prevention structure 6A is not disposed is the portion farther from the body case slits 2 of the converter 101 of FIG. 1. Therefore, during the destruction of the diode module 4A in the converter 101, debris can be prevented from going out of the converter 101 through the body case slits 2. In other words, the nonplacement area 7A, being the area farther from the placement face 15 for the body case slits 2, can prevent a sealing material filled into the diode module 4A from bursting out through the body case slits 2 despite the destruction of the diode module 4A.

The shape of the nonplacement area 7A where the breakage prevention structure 6A is not disposed can be variously set, depending on shape of the converter 101, the location of the body case slits 2 in the body case 1 of the converter 101, shape of each body case slit 2, location of the diode module 4A inside the converter 101, and the shape of the diode module 4A, among others.

Figure 3:
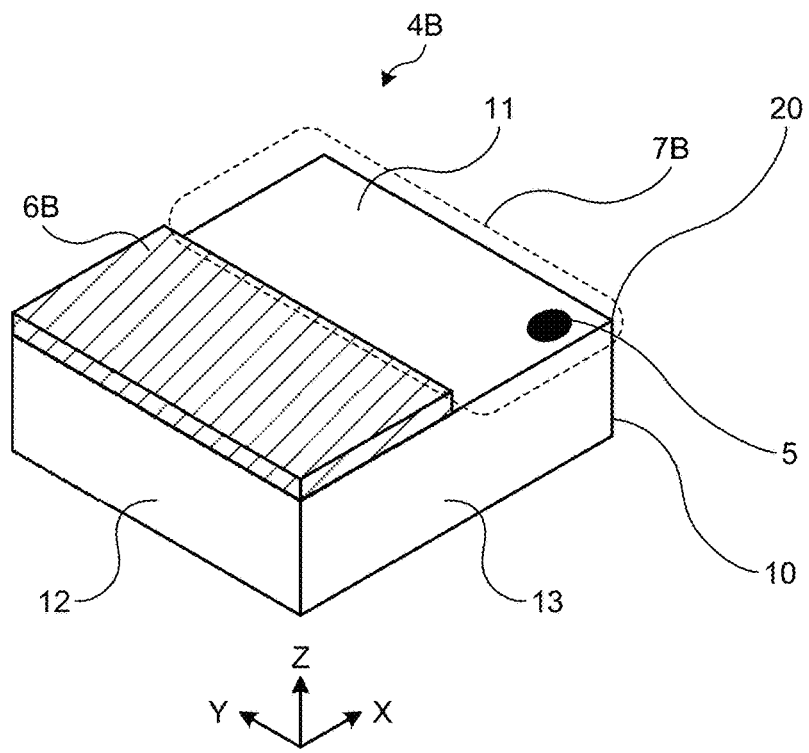
FIG. 3 is a diagram illustrating a diode module with another configuration example that is included in the converter according to the first embodiment.

FIG. 3 is a diagram illustrating a diode module with another configuration example that is included in the converter according to the first embodiment. The diode module 4B is an example of the diode module 4. As with the diode module 4A, the diode module 4B is assumed to be disposed like the diode module 4 of FIG. 1 inside the converter 101.

As in the diode module 4A, the module case 10 of the diode module 4B has the top face 11 and the bottom face as faces with largest areas among exterior wall faces serving as a covering of the diode module 4B.

As illustrated in FIG. 3, the diode module 4B, which features the different configuration example for the diode module 4, includes a breakage prevention structure 6B instead of the breakage prevention structure 6A, as compared with the diode module 4A. As with the breakage prevention structure 6A, the breakage prevention structure 6B includes a noncombustible hard material or a noncombustible adhesive.

The breakage prevention structure 6B is a rectangular plate-shaped member. On the top face 11 of the module case 10 of the diode module 4B, the breakage prevention structure 6B is disposed closer to the placement face 15 for the body case slits 2 than the middle of the top face 11 is.

Compared with the diode module 4A, the diode module 4B includes a nonplacement area 7B instead of the nonplacement area 7A. The nonplacement area 7B is a rectangular area. As with the nonplacement area 7A, the nonplacement area 7B is an area including the reference point 5. The nonplacement area 7B is the area of the top face 11 of the module case 10 that is farther from the placement face 15 than the middle of the top face 11 is. As with the above-described nonplacement area 7A, the nonplacement area 7B only has to be the area of the top face 11 where the breakage prevention structure 6B is not disposed and be farther from the placement face 15 than the middle of the top face 11 is. The nonplacement area 7B may have, for example, a polygonal shape, a circular shape, or another shape. Since the reference point 5 is illustrated for the convenience of explanation, it goes without saying that the nonplacement area 7B does not need to include the reference point 5. The breakage prevention structure 6B is an example of the second breakage prevention structure.

The shape of each of the diode modules 4A and 4B is not limited to the rectangular parallelepiped and may be a prism other than the rectangular parallelepiped. In that case as well, each of the prism-shaped diode modules 4A and 4B is disposed, with at least one of its faces that do not have largest areas facing the placement face 15 for the body case slits 2, a breakage prevention structure is disposed on the top face 11 of each of the diode modules 4A and 4B, and each of the diode modules 4A and 4B includes a nonplacement area. As with the nonplacement areas 7A and 7B, the nonplacement area in that case, too, is on a side opposite to the placement face 15 for the body case slits A description is provided here of a diode module as a comparative example (hereinafter referred to as "comparative diode module"). A module case of the comparative diode module has an entire surface covered with a breakage prevention structure. This comparative diode module can experience destruction that exceeds a design assumption. In the case of this comparative diode module, a face with a largest area, for example, is highly likely to receive a significant force and be destroyed. When, for example, the comparative diode module has the face with the largest area as a top face and is destroyed near body case slits, broken pieces of a component of the comparative diode module can scatter out of the comparative diode module and then out of a converter through the body case slits. In this case, reliability of equipment disposed externally to the converter is deteriorated. In addition, the special structure provided for the comparative diode module to prevent destruction causes design complexity and complexity of a manufacturing process, resulting in lower reliability of the comparative diode module and increased manufacturing costs.

For the diode modules 4A and 4B according to the first embodiment, on the other hand, the destruction of each of the diode modules 4A and 4B is directed to the portion (nonplacement area 7A or 7B) that allows for a smaller impact of destruction, that is to say, the portion farther from the body case slits 2. Therefore, broken pieces generated by the destruction can be prevented from scattering out of the converter 101 during the destruction of each of the diode modules 4A and 4B. The diode modules 4A and 4B are based on the assumption that the diode modules 4A and 4B each experience destruction that exceeds a design assumption, and as described above, each direct, when the destruction occurs, the destruction to the portion where broken pieces that result from the destruction do not scatter out of the converter 101. In addition, the diode modules 4A and 4B themselves do not require special structures, thus each preventing an increase in manufacturing costs because of no design complexity and no complexity of a manufacturing process.

As described above, the module case 10 of each of the diode modules 4A and 4B according to the first embodiment includes the portion where the breakage prevention structure 6A or 6B is disposed and the nonplacement area 7A or 7B where the breakage prevention structure 6A or 6B is not disposed, with consideration given to the placement of the diode module 4A or 4B inside the converter 101. Accordingly, during the destruction of each of the diode modules 4A and 4B that exceeds the design assumption, the converter 101 can direct the destruction to the nonplacement area 7A or 7B.

Therefore, even when destruction occurs to such an extent that broken pieces of a component of the diode module 4A or 4B are scattered out of the diode module 4A or 4B, the converter 101 can reliably prevent the broken pieces, which are debris, from scattering out of the converter 101. Consequently, despite the destruction of the diode module 4A or 4B, the converter 101 allows for maintained reliability of equipment disposed externally to the converter 101.

Second Embodiment

Figure 4:
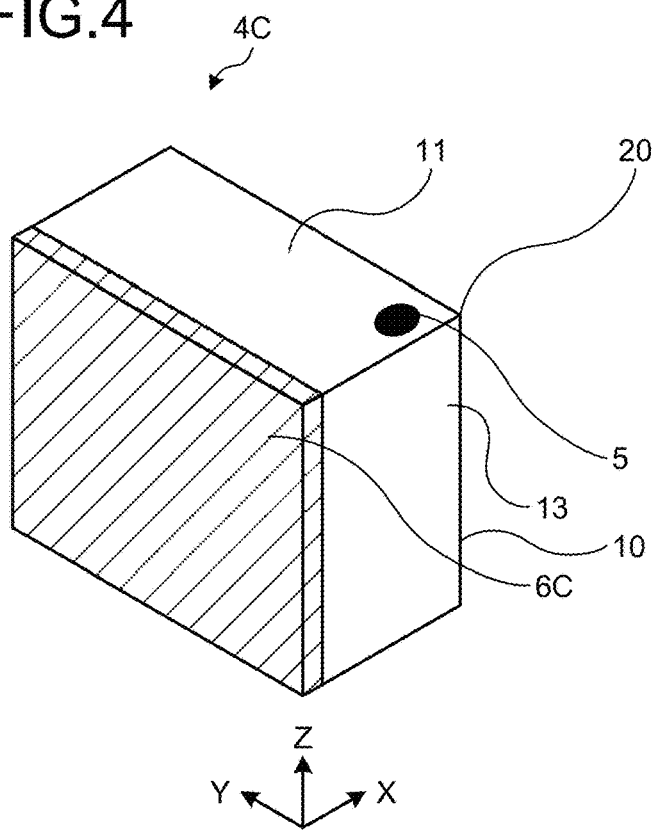
FIG. 4 is a diagram illustrating a configuration of a diode module included in a converter according to a second embodiment.

With reference to FIG. 4, a description is provided next of a second embodiment. In the second embodiment, a breakage prevention structure is disposed on the front face 12 of the module case 10 of a diode module. The front face 12 of the module case 10 is not illustrated in FIG. 4 and the subsequent drawings.

FIG. 4 is a diagram illustrating a configuration of the diode module included in a converter according to the second embodiment. The diode module 4C is an example of the diode module 4. As with the diode module 4A, the diode module 4C is assumed to be disposed like the diode module 4 of FIG. 1 inside the converter 101.

Unlike the diode modules 4A and 4B, the diode module 4C features the front face 12 of the module case 10 (that corresponds to the front face 12 of FIG. 2) as a face with a largest area among exterior wall faces serving as a covering of the diode module 4C. The front face 12 of the diode module 4C is a counter face facing the placement face (first face) 15 for the body case slits 2 of the converter 101. The diode module 4C is such that the disposed breakage prevention structure 6C entirely covers the front face 12 (counter face) of the module case 10. As with the breakage prevention structure 6A, the breakage prevention structure 6C includes a noncombustible hard material or a noncombustible adhesive.

The breakage prevention structure 6C is disposed, entirely covering the front face 12 of the module case 10 of the diode module 4C. In other words, the front face 12 of the module case 10 of the diode module 4C has no nonplacement area. The breakage prevention structure 6C is an example of a first breakage prevention structure.

As described above, the diode module 4C according to the second embodiment is disposed, with the front face 12 of the module case 10 where the breakage prevention structure 6C is disposed facing the placement face 15 for the body case slits 2. In other words, for the diode module 4C, since the counter face (front face), which faces the placement face 15 among the exterior wall faces of the module case 10, has the largest area compared with noncounter faces that are exterior wall faces other than the counter face, the breakage prevention structure 6C is disposed on the counter face to prevent a breakage of the module case 10. No breakage prevention structures 6C are disposed on the noncounter faces among the exterior wall faces of the module case 10. For the diode module 4C, no breakage prevention structures 6C may be disposed on some or all of the noncounter faces. In other words, there can be a configuration such that no breakage prevention structures 6C are disposed on at least some of the noncounter faces.

As described above, the diode module 4C has the disposed breakage prevention structure 6C that covers the entire front face 12 of the module case 10. Therefore, during destruction of the diode module 4C, the portion where the breakage prevention structure 6C is disposed is not destroyed. On the other hand, the faces with no breakage prevention structures 6C, that is to say, the faces other than the front face among the exterior wall faces, which serve as the covering of the diode module 4C, can be destroyed. This means that by having the breakage prevention structure 6C disposed on the entire counter face, the diode module 4C is enabled to have a strength difference between the counter face and the noncounter faces where no breakage prevention structures 6C are disposed and direct the destruction to the noncounter faces, which do not face the body case slits 2.

The diode module 4C may be disposed so that two of the faces of the module case 10 of the diode module 4C, namely the front face and one of the side faces (e.g., the right side face 13), face the placement face 15 for the body case slits 2. In that case, the entire front face and the right side face 13 of the module case 10 of the diode module 4C are counter faces, and the breakage prevention structures 6C are disposed on the entire front face and the entire right side face 13. For example, the breakage prevention structures 6C are disposed on the front face 12 and the right side face 13 of the module case 10 when the placement face 15 for the body case slits 2 forms an angle of less than 90 degrees with the front face 12 of the module case 10 of the diode module 4C and an angle of less than 90 degrees with the right side face 13 of the module case 10 of the diode module 4C.

The diode module 4C is not limited to the shape of a rectangular parallelepiped, and its shape may be a prism other than the rectangular parallelepiped. In that case as well, the prism-shaped diode module 4C is disposed, with at least one of its faces facing the placement face 15 for the body case slits 2, and a breakage prevention structure is disposed on the counter face that faces the placement face 15 among the faces of the diode module 4C.

As described above, the module case 10 of the diode module 4C according to the second embodiment includes the face (front face) where the breakage prevention structure 6C is disposed and the faces where no breakage prevention structures 6C are disposed, with consideration given to the placement of the diode module 4C inside the converter 101. Accordingly, during the destruction of the diode module 4C, the converter 101 can direct the destruction to the faces other than the counter face of the module case 10.

Therefore, even when destruction occurs to such an extent that broken pieces of a component of the diode module 4C are scattered out of the diode module 4C, the converter 101 can reliably prevent the broken pieces, which are debris, from scattering out of the converter 101. Consequently, despite the destruction of the diode module 4C, the converter 101 allows for maintained reliability of equipment disposed externally to the converter 101.

Third Embodiment

Figure 5:
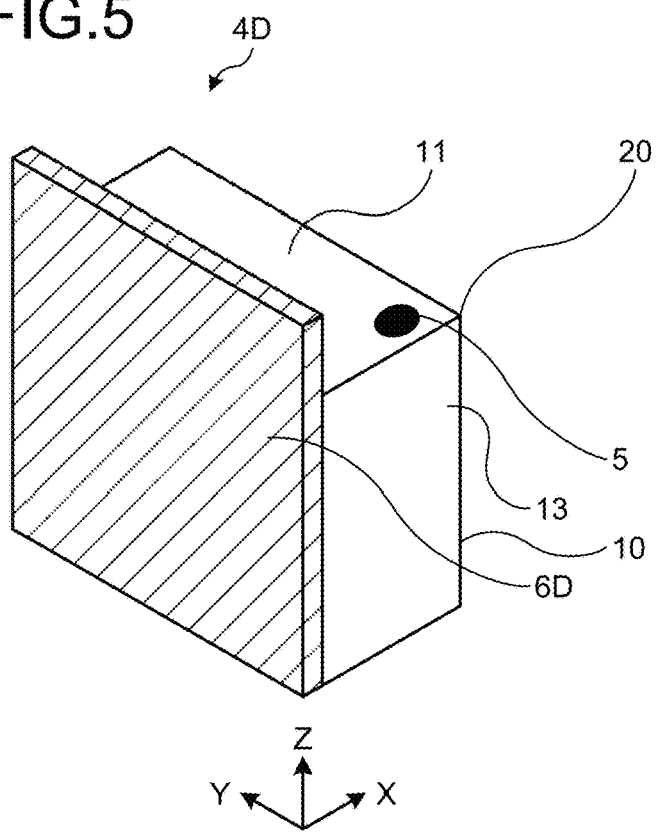
FIG. 5 is a diagram illustrating a configuration of a diode module included in a converter according to a third embodiment.

With reference to FIG. 5, a description is provided next of a third embodiment. In the third embodiment, the front face 12 of the module case 10 of a diode module is where a breakage prevention structure larger than the front face 12 is disposed.

FIG. 5 is a diagram illustrating a configuration of the diode module included in a converter according to the third embodiment. The diode module 4D is an example of the diode module 4. As with the diode module 4A, the diode module 4D is assumed to be disposed like the diode module 4 of FIG. 1 inside the converter 101.

As with the diode module 4C, the diode module 4D features the front face 12 of the module case 10 (that corresponds to the front face 12 of FIG. 2) as a face with a largest area among exterior wall faces serving as a covering of the diode module 4D. The front face of the diode module 4D is a counter face facing the placement face (first face) 15 for the body case slits 2 of the converter 101. The diode module 4D is such that the disposed breakage prevention structure 6D entirely covers the front face 12 (counter face) of the module case 10. As with the breakage prevention structure 6A, the breakage prevention structure 6D includes a noncombustible hard material or a noncombustible adhesive.

The breakage prevention structure 6D has a larger area than the front face 12 of the module case 10 of the diode module 4D. This means that a face (back face) of the breakage prevention structure 6D that faces the front face 12 of the module case 10 has the larger area than the front face 12 of the module case 10. In other words, the face of the breakage prevention structure 6D includes an area in contact with the counter face (front face 12 of the module case 10) of the diode module 4D and has the larger area than the front face 12 of the module case 10. The breakage prevention structure 6D is disposed, entirely covering the front face 12 of the module case 10 of the diode module 4D. In other words, the front face 12 of the module case 10 of the diode module 4D has no nonplacement area. The breakage prevention structure 6D is an example of the first breakage prevention structure.

A portion of the breakage prevention structure 6D that is not in contact with the front face 12 of the module case 10 extends longitudinally of the body case slits 2. In other words, the breakage prevention structure 6D is positioned, facing the body case slits 2. For example, the breakage prevention structure 6D becomes protrusive from the top face 11 of the module case 10 of the diode module 4D that is a noncounter face extending in a direction intersecting the front face 12, which is the counter face. When the interior of the converter 101 is seen from outside the converter 101 through the body case slits 2, the diode module 4D is hidden from view by the disposed breakage prevention structure 6D. No breakage prevention structures 6D are disposed on those noncounter faces among the exterior wall faces of the module case 10. For the diode module 4D, no breakage prevention structures 6D may be disposed on some or all of the noncounter faces. In other words, there can be a configuration such that no breakage prevention structures 6D are disposed on at least some of the noncounter faces.

As described above, the module case 10 of the diode module 4D according to the third embodiment includes the face (front face) where the breakage prevention structure 6D is disposed and the faces where no breakage prevention structures 6D are disposed, with consideration given to the placement of the diode module 4D inside the converter 101. Accordingly, during destruction of the diode module 4D, the converter 101 can direct the destruction to the faces other than the front face.

Furthermore, the breakage prevention structure 6D has the portion protruding from the top face 11 of the module case 10, so that during the destruction of the diode module 4D, broken pieces scattering from the top face 11 of the module case 10 can be prevented from scattering out of the converter 101.

Therefore, even when destruction occurs to such an extent that broken pieces of a component of the diode module 4D are scattered out of the diode module 4D, the converter 101 can reliably prevent the broken pieces, which are debris, from scattering out of the converter 101. Consequently, despite the destruction of the diode module 4D, the converter 101 allows for maintained reliability of equipment disposed externally to the converter 101.

In the first through third embodiments, the breakage prevention structures 6C and 6D are the first breakage prevention structures, and the breakage prevention structures 6A and 6B are the second breakage prevention structures.

Figure 6:
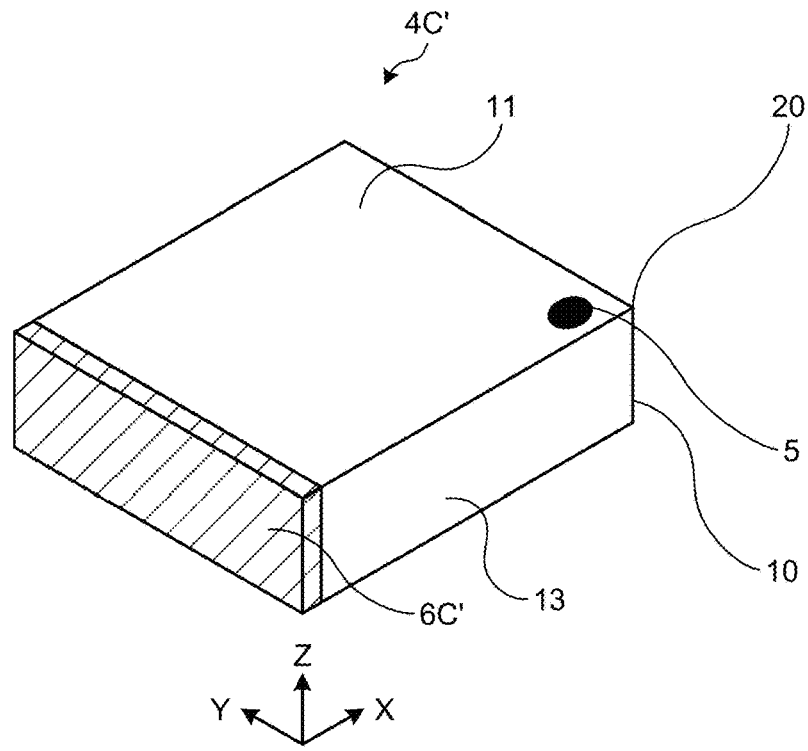
FIG. 6 is a diagram illustrating a diode module with another configuration example that is included in the converter according to the second embodiment.
Figure 7:
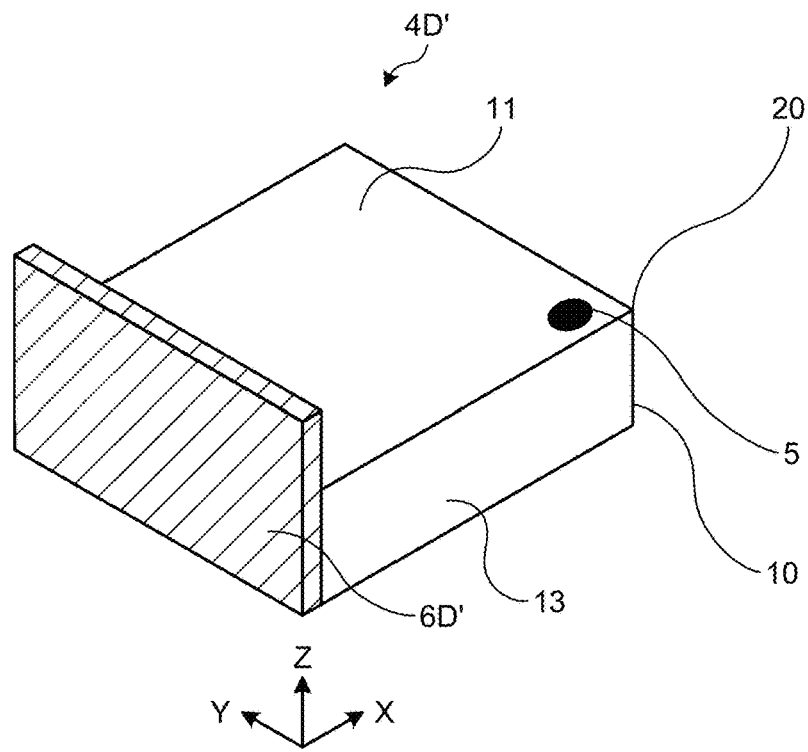
FIG. 7 is a diagram illustrating a diode module with another configuration example that is included in the converter according to the third embodiment.

A description is provided here of modifications of the second and third embodiments. FIG. 6 is a diagram illustrating a diode module with another configuration example that is included in the converter according to the second embodiment. FIG. 7 is a diagram illustrating a diode module with another configuration example that is included in the converter according to the third embodiment. The diode module 4C' illustrated in FIG. 6 is a modification of the diode module 4C illustrated in FIG. 4, and the diode module 4D' illustrated in FIG. 7 is a modification of the diode module 4D illustrated in FIG. 5.

In the above-described second and third embodiments, the front faces of the diode modules 4C and 4D, namely the counter faces, each have been described to have the largest area among the exterior wall faces and be where the breakage prevention structure 6C or 6D is disposed. However, each of the breakage prevention structures 6C and 6D only has to be disposed to cover the entire counter face that faces the face (first face) with the body case slits 2 of the body case 1 of the converter 101. For example, as illustrated in FIGS. 6 and 7, the diode modules 4C' and 4D' may be configured, each having, among exterior wall faces of the module case 10, a counter face facing the placement face (first face) 15 for the body case slits 2 of the converter 101 as the front face and a noncounter face with a largest area that extends in a direction (X direction) intersecting the counter face as the top face 11, with a breakage prevention structure 6C' or 6D' being disposed and entirely covering the front face that has a smaller area than the top face 11 and with no breakage prevention structures 6C' or 6D' disposed on noncounter faces including the top face 11. In these cases, destruction can be easily directed to the top face 11 with the largest area among the exterior wall faces of the module case 10, allowing for an effect similar to those of the above-described second and third embodiments.

In addition, as illustrated in FIG. 7, for example, the diode module 4D' has the disposed breakage prevention structure 6D' that covers the entire front face, which has the smaller area than the top face 11, and the breakage prevention structure 6D' becomes protrusive from the top face 11 of the module case 10 of the diode module 4D' as with the breakage prevention structure 6D described in the above third embodiment. The noncounter faces, including the top face 11, are where no breakage prevention structures 6D' are disposed. In this case, destruction can be easily directed to the top face 11 with the largest area among the exterior wall faces of the module case 10, and during the destruction of the diode module 4D', broken pieces scattering from the top face 11 of the module case 10 can be further prevented from scattering out of the converter 101.

In the above-described first embodiment, the noncounter placement face (top face 11), which is the noncounter face with the largest area among the exterior wall faces of the module case 10 of each of the diode modules 4A and 4B, has been described to be where the breakage prevention structure 6A or 6B is disposed and have at least the portion of the area farther from the placement face (first face) 15 than the middle of the noncounter placement face is as the nonplacement area 7A or 7B. However, as long as each of the breakage prevention structures 6A and 6B is disposed so that the noncounter placement face, which has the largest area among the noncounter faces included in the exterior wall faces of the module case 10, includes at least the portion of the area, which is farther from the first face than the middle of the noncounter placement face is, as the nonplacement area 7A or 7B, any faces other than the noncounter placement face among the exterior wall faces of the module case 10 may also be where the breakage prevention structures 6A or 6B are disposed. For example, in the case of the diode module 4A or 4B that has the disposed breakage prevention structure 6A or 6B on the noncounter placement face, which is the noncounter face with the largest area among the exterior wall faces of the module case 10, in addition to having at least the portion of the area farther from the first face than the middle of the noncounter placement face is as the nonplacement area 7A or 7B, the diode module 4A or 4B may have the above-described breakage prevention structure 6C' or 6D' disposed so that the front face (counter face), which has a smaller area than the top face and faces the placement face (first face) 15 for the body case slits 2 of the converter 101, is entirely covered. In that case, the diode module 4A or 4B can direct destruction to the nonplacement area 7A or 7B as described in the first embodiment and make the counter face, which faces the placement face 15 for the body case slits 2 of the converter 101, difficult to destroy. In addition, the converter 101 allows for even enhanced maintenance of reliability of equipment disposed externally to the converter 101 despite the destruction of the diode module 4A or 4B.

In the above-described third embodiment, the diode module 4D has been described to have the disposed breakage prevention structure 6D that covers the entire front face 12 of the module case 10 and becomes protrusive from the top face 11 of the module case 10. However, the breakage prevention structure 6D' disposed on the front face 12 of the module case 10 only has to cover the entire front face, which is the counter face, at a face that includes an area in contact with the counter face and has a larger area than the counter face. For example, the diode module 4D' may be configured to have a disposed breakage prevention structure 6D' that covers the entire front face 12 of the module case 10 and becomes protrusive from the top face 11 and the two side faces of the module case 10. In that case, even when destruction is directed to any of noncounter faces where no breakage prevention structures 6D' are disposed, broken pieces scattering from the diode module 4D' can be further prevented from scattering out of the converter 101 during the destruction of the diode module 4D'.

The above configurations illustrated in the embodiments are illustrative, can be combined with other techniques that are publicly known, and can be partly omitted or changed without departing from the gist. The embodiments can be combined with each other.

REFERENCE SIGNS LIST 1 body case; 2 body case slit; 3 cooling fin; 4, 4A to 4D, 4C', 4D' diode module; 5 reference point; 6A to 6D, 6C', 6D' breakage prevention structure; 7A, 7B nonplacement area; 10 module case; 11 top face; 12 front face; 13 right side face; 15 placement face; 20 vertex; 101 converter.

The invention claimed is:

1. A power converter comprising:
a diode module including a diode bridge with a rectification function disposed inside a module case; and
a body case housing the diode module and including an opening in a part of a first face, wherein
the module case has exterior wall faces, including a counter face facing the first face and a noncounter face that is an exterior wall face other than the counter face, with a breakage prevention structure being disposed on at least one of the counter face or the noncounter face to prevent a breakage of the module case,
when the counter face is where the breakage prevention structure is disposed, the breakage prevention structure is a first breakage prevention structure entirely covering the counter face, and
when the noncounter face is where the breakage prevention structure is disposed, the breakage prevention structure is a second breakage prevention structure, the noncounter face where the breakage prevention structure is disposed being a noncounter placement face that has a largest area among exterior wall faces of the module case and is any of a plurality of the noncounter faces, the noncounter placement face including at least a portion of an area farther from the first face than a middle of the noncounter placement face is as a non-placement area where the breakage prevention structure is not disposed, the noncounter placement face except for the at least the portion being where the nonplacement area is not included.

2. The power converter according to claim 1, wherein
when both the counter face and the noncounter face are where the breakage prevention structure is disposed, and the noncounter placement face is where the second breakage prevention structure is disposed, the counter face with a smaller area than the noncounter placement face is where the first breakage prevention structure is disposed.

3. The power converter according to claim 1, wherein
when the counter face is where the first breakage prevention structure is disposed, the first breakage prevention structure entirely covers the counter face at a face that includes an area in contact with the counter face and has a larger area than the counter face.

4. The power converter according to claim 1, wherein
the module case has the counter face as a front face and the noncounter face among the exterior wall faces as a top face extending in a direction intersecting the counter face, and
when the counter face is where the first breakage prevention structure is disposed, the first breakage prevention structure becomes protrusive from the top face among exterior wall faces of the module case.

5. The power converter according to claim 1, wherein
when the counter face is where the first breakage prevention structure is disposed, the first breakage prevention structure includes one of a noncombustible hard material and a noncombustible adhesive.

6. The power converter according to claim 1, wherein
when the noncounter placement face is where the second breakage prevention structure is disposed, the second breakage prevention structure includes one of a noncombustible hard material and a noncombustible adhesive.

7. The power converter according to claim 2, wherein
when the counter face is where the first breakage prevention structure is disposed, the first breakage prevention structure includes one of a noncombustible hard material and a noncombustible adhesive.

8. The power converter according to claim 3, wherein
when the counter face is where the first breakage prevention structure is disposed, the first breakage prevention structure includes one of a noncombustible hard material and a noncombustible adhesive.

9. The power converter according to claim 4, wherein
when the counter face is where the first breakage prevention structure is disposed, the first breakage prevention structure includes one of a noncombustible hard material and a noncombustible adhesive.

* * * * *